(12) United States Patent
Zaitsev et al.

(10) Patent No.: US 8,354,844 B2
(45) Date of Patent: Jan. 15, 2013

(54) METHOD FOR DATA ACQUISITION ACCELERATION IN MAGNETIC RESONANCE IMAGING (MRI) WITH N-DIMENSIONAL SPATIAL ENCODING USING TWO OR MORE RECEIVER COIL ARRAYS AND NON-LINEAR PHASE DISTRIBUTIONS

(75) Inventors: Maxim Zaitsev, Freiburg (DE); Juergen Hennig, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 231 days.

(21) Appl. No.: 12/645,505

(22) Filed: Dec. 23, 2009

(65) Prior Publication Data
US 2011/0148410 A1 Jun. 23, 2011

(51) Int. Cl.
*G01V 3/00* (2006.01)
(52) U.S. Cl. ........................ 324/307; 324/309
(58) Field of Classification Search ........ 324/300–322; 600/410, 411; 382/128–131, 284; 345/92
See application file for complete search history.

(56) References Cited

U.S. PATENT DOCUMENTS

| | | | |
|---|---|---|---|
| 6,989,673 B2 * | 1/2006 | Zhu | 324/318 |
| 7,053,618 B2 * | 5/2006 | Zhu | 324/318 |
| 7,064,547 B1 * | 6/2006 | King et al. | 324/309 |
| 7,075,301 B2 * | 7/2006 | Zhu | 324/318 |
| 7,075,302 B2 * | 7/2006 | Zhu | 324/318 |
| 7,282,917 B1 * | 10/2007 | Brau et al. | 324/318 |
| 7,495,437 B2 * | 2/2009 | Griswold et al. | 324/307 |
| 7,671,589 B2 * | 3/2010 | Griswold et al. | 324/307 |
| 7,864,999 B2 * | 1/2011 | Chang et al. | 382/128 |
| 7,902,823 B2 * | 3/2011 | Griswold et al. | 324/307 |
| 8,150,491 B2 * | 4/2012 | Jung et al. | 600/410 |
| 2005/0110487 A1 * | 5/2005 | Zhu | 324/309 |
| 2005/0110488 A1 * | 5/2005 | Zhu | 324/309 |
| 2005/0134267 A1 * | 6/2005 | Zhu | 324/309 |
| 2005/0134268 A1 * | 6/2005 | Zhu | 324/309 |
| 2006/0284812 A1 * | 12/2006 | Griswold et al. | 345/92 |
| 2007/0110290 A1 * | 5/2007 | Chang et al. | 382/128 |
| 2008/0242972 A1 * | 10/2008 | Jung et al. | 600/410 |
| 2008/0309336 A1 * | 12/2008 | Griswold et al. | 324/309 |
| 2009/0092303 A1 * | 4/2009 | Griswold et al. | 382/131 |
| 2010/0201363 A1 * | 8/2010 | Griswold et al. | 324/314 |

(Continued)

OTHER PUBLICATIONS

Larkman DJ., Nunrs RG., "Parallel magnetic resonance imaging". Review. Phys Med Biol 52:R15-R55 (2007).

(Continued)

*Primary Examiner* — Melissa Koval
*Assistant Examiner* — Tiffany Fetzner
(74) *Attorney, Agent, or Firm* — Paul Vincent

(57) ABSTRACT

A method for accelerating data acquisition in MRI with N-dimensional spatial encoding has a first method step in which a transverse magnetization within an imaged object volume is prepared having a non-linear phase distribution. Primary spatial encoding is thereby effected through application of switched magnetic fields. Two or more RF receivers are used to simultaneously record MR signals originating from the imaged object volume, wherein, for each RF receiver, an N-dimensional data matrix is recorded which is undersampled by a factor $R_i$ per selected k-space direction. Data points belonging to a k-space matrix which were not recoded by a selected acquisition schema are reconstructed using a parallel imaging method, wherein reference information concerning receiver coil sensitivities is extracted from a phase-scrambled reconstruction of the undersampled data matrix. The method generates a high-resolution image free of artifacts in a time-efficient manner by improving data sampling efficiency and thereby reducing overall data acquisition time.

19 Claims, 6 Drawing Sheets

U.S. PATENT DOCUMENTS

2011/0148410 A1* 6/2011 Zaitsev et al. ............... 324/309

OTHER PUBLICATIONS

Shannon CE., "Communication in the presence of noise", Proc. Institute of Radio Engineers 37(1):10 -21 (1949).

Sodickson DK, Manning WJ., "Simultaneous acquisition of spatial harmonics (SMASH): fast imaging with radiofrequency coil arrays", Magn Reson Med 38(4):591-603 (1997).

Pruessmann KP, Weiger M, Scheidegger MB, Boesiger P., "SENSE: sensitivity encoding for fast MRI", Magn Reson Med 42(5):952-62 (1999).

Griswold MA, Jakob PM, Heidemann RM, Nittka M, Jellus V, Wang J, Kiefer B, Haase A, "Generalized autocalibrating partially parallel acquisitions (GRAPPA)", Magn Reson Med 47(6):1202-10 (2002).

Ullmann P, Tieng Q, Galloway G, Hennig J, "Relative SENSE (rSENSE) and Calculation of Sensitivity Maps from k-Space Reconstruction Coefficients (SMACKER)", in: Proceedings of ISMRM, Kyoto, p. 2406 (2004).

Wang J, Kluge T, Nittka M, Jellus V, Kuehn B, Kiefer B, "Parallel Acquisition Techniques with Modified SENSE Reconstruction mSENSE", Proceedings of the First Wurzburg Workshop on Parallel Imaging, Wurzburg, p. 92 (2001).

Maudsley AA, "Dynamic Range Improvement in NMR Imaging Using Phase Scrambling", Journal of Magnetic Resonance 76:287-305 (1988).

Wedeen VJ, Chao YS, Ackerman JL, "Dynamic range compression in MRI by means of a nonlinear gradient pulse", Magn Reson Med 6(3):287-95 (1988).

Pipe JG, "Spatial encoding and reconstruction in MRI with quadratic phase profiles", Magn Reson Med 33:24-33 (1995).

Satoshi Ito S, Yamada Y, "Alias-free image reconstruction using Fresnel transform in the phase-scrambling Fourier imaging technique", Magn Reson Med 60:422-30 (2008).

Hennig J, Welz AM, Schultz G, Korvink J, Liu Z, Speck O, Zaitsev M, Parallel imaging in non-bijective, curvilinear magnetic field gradients: a concept study. MAGAMA 21(1-2):5-14 (2008).

Schultz G, Hennig J, Zaitsev M, "Image Reconstruction from ambiguous PatLoc-encoded MR data", In Proceedengs of ISMRM, Toronto, p. 786 (2008).

* cited by examiner

METHOD FOR DATA ACQUISITION ACCELERATION IN MAGNETIC RESONANCE IMAGING (MRI) WITH N-DIMENSIONAL SPATIAL ENCODING USING TWO OR MORE RECEIVER COIL ARRAYS AND NON-LINEAR PHASE DISTRIBUTIONS

BACKGROUND OF THE INVENTION

The present invention relates to an MRI method and an MRI apparatus to implement the method which generates images using MR signals detected by an array of receiver coils. More specifically, the present invention relates to an MRI method and an MRI apparatus to generate a high-resolution image, free of artifacts, in a time-efficient manner. The present invention describes a method for accelerating data acquisition in MRI with N-dimensional spatial encoding.

Nyquist Condition for MRI

Conversion of analog spin induction signals recorded by the received coils to a set of discrete values is termed sampling. For time domain signal a sampling theorem exists, which requires the sampling frequency to exceed the maximum frequency observed in the spectrum of the recorded signal by a factor of two [2]. This is known as Shannon or Nyquist condition. For traditional MRI using linear magnetic field gradients, the time domain variable is replaced with a parameter k, defined as a time integral of the gradient fields applied from the moment of excitation of the spin system. Linearity of the precession frequency dependence in space induced by the linear field gradients defines simple correspondence rules between the time-domain sampling and MRI. For a set of MR signals recorded at a fixed interval $\Delta k$, the inverse of the sampling interval in k-space defines the image field of view (FOV) and the inverse of the k-space sampling extent, $k_{max}$, defines the image resolution. In order to encode two- or three-dimensional spin density distributions, magnetic field gradients are applied in different dimensions to fill a k-space matrix either in a single k-space trajectory or following multiple excitations.

If the sampling theorem is violated, the spectral components of the original signals will appear at the wrong position in the discrete spectrum representation. This phenomenon is termed aliasing. In the case of MRI, aliasing will appear if the FOV corresponding to the selected k-space sampling interval fails to cover the entire imaged object. Aliasing in the frequency-encoding dimension is typically suppressed by the application of time-domain filtering prior to digitalization of the signals. However, this is not possible for phase encoding dimensions. In the later case, aliasing or folding artifacts occur, which manifest themselves as parts of the object extending past the boundary of the FOV to appear on the other side of the image. In case of Cartesian multidimensional sampling, the aliasing artifacts originating from undersampling in different dimensions are created by a simple multiplication and can be separately treated in the reconstruction, e.g. when specialized alias suppressing reconstruction techniques are applied. These are typically based on utilizing some additional knowledge, either about the object itself or about the structure of the signals, e.g. when coil arrays are used for reception.

Parallel Imaging

The parallel imaging concept was introduced in MRI in 1997 [3] based on employing receiver coil arrays consisting of multiple coil elements and being capable of simultaneous reception of the spin induction signals, where the spatial variation between the sensitivities of the individual elements of the array was used as additional information to encode spatial distributions of the MR signals. Parallel imaging affords a reduction of the data acquisition time with the spatial resolution kept at the original setting. The reduced acquisition time implies undersampling of the k-space data matrix, provided the original full k-space matrix consisted of all the points required to unambiguously encode the selected imaging volume with the given spatial resolution. Undersamling of the data matrix means that not all k-space points are acquired, leading to a spatial aliasing in the images reconstructed using a trivial Fourier transform approach. Reconstruction of the missing information can be accomplished either as unfolding in image space (so-called "Sensitivity Encoding", SENSE [4]) or directly in k-space by interpolating the missing k-space samples based on the acquired neighboring points using a certain interpolation kernel (so-called GRAPPA approach [5]). The maximum k-space undersampling factor $R_i$ per selected spatial dimension is thus given by a number of coil elements having a variable sensitivity along this dimension. All the previously proposed parallel imaging and reconstruction methods, which do not rely on an a priori information about the imaged sample, have a common feature of employing receiver coil array sensitivities to suppress undersampling artifacts, either explicitly or implicitly [1]. Images originating from typical accelerated MRI acquisitions experience a homogeneous reduction of SNR by a factor of $\sqrt{R}$, where R is the total acceleration factor, $R=R_1 * R_2 * \ldots$. The unfolding process results in the additional spatially-inhomogeneous reduction of SNR, characterized through so-called geometry factor (g-factor). The g-factor depends on the sampling and reconstruction parameters as well as the geometry of the receiver coil array used.

One of the problems arising during implementation of parallel imaging methods originates from the fact that, for the parallel imaging reconstruction to work, coil calibration information needs to be acquired in a manner consistent with the actual imaging scan. For the implementations relying on a separate calibration scan, this consistency can easily be broken via dynamic processes in the imaged object, motion or scanner instability. That is why, in addition to the currently standard pre-scan-based coil calibration, where coil sensitivity information is acquired before or after the actual imaging scan, a so-called auto-calibrating approach is often employed, where a certain area of the k-space matrix (typically close to the k-space origin) is sampled densely to satisfy the Nyquist conditions for the given FOV. These additional k-space samples are often referred to as auto-calibrating scans (ACS). The requirement to calibrate coil sensitivities slows down the total acquisition time or results in an additional decrease in SNR of the reconstructed images if the total acquisition time is kept constant via an additional increase in the acceleration factor. Additionally, both separate pre-scan and integrated auto calibration methods are incompatible with certain MRI acquisition methods, like echo planar imaging (EPI), acquisitions with a continuously moving table and many more.

SENSE (Sensitivity Encoding)

Parallel imaging principles are best visualized with the example of the image-space methods, such as SENSE [4]. Image reconstruction in SENSE starts with a direct 2D or 3D fast Fourier transform (FFT) of the undersampled data resulting in an MR image with a reduced FOV. In case that this reduced FOV is smaller than the entire imaged object, which is typically the case for accelerated acquisitions, FOV aliasing artifacts occur which manifest themselves as folding of the object along the corresponding dimension. At this step SENSE reconstruction is applied, which attempts to unfold the aliased image on a pixel-by-pixel basis. This is only then possible, because the image data from each individual receiver coil are modulated with the spatially varying sensitivity of the coil and this modulation occurs prior to the folding of the image. Provided the coil modulation functions are known during reconstruction, it is possible to calculate the weighted aliasing patterns and solve for the original pixel intensities. Hence, classical SENSE reconstruction requires the accurate knowledge of the receiver coil sensitivities and produces one composite image. Fortunately, coil sensitivity profiles are relatively smooth, which makes it possible to perform the sensitivity estimation based on a relatively quick low-resolution calibration scan, including consecutive acquisitions of the same object with the array coil and a volume (body) coil, respectively. If no volume coil is available for the measurement, it is possible to determine relative coil sensitivities, with regard to either one of the array coils or a combination thereof, which is often referred to as relative SENSE (rSENSE) [6] or modified SENSE (mSENSE) [7]. It is possible to implement both rSENSE and mSENSE as auto-calibrating techniques, where the central k-space region of the actual accelerated acquisition is sampled densely to produce a low-resolution full FOV image for coil sensitivity calibration.

GRAPPA (GeneRalized Autocalibrating Partially Parallel Acquisition)

In contrast to the above, the k-space-based GRAPPA approach [5] decouples the image unfolding steps from the coil combination, which allows one to optimize separately the unfolding process as well as the subsequent combination of the individual coil images. For this reason, GRAPPA has become one of the most robust and frequently used parallel imaging methods.

Unaliasing in GRAPPA takes place in k-space via interpolation of the missing k-space samples based on the acquired neighboring scans. The interpolation kernel is described by so-called coil weighting coefficients, which for the given undersampling pattern are defined by the coil sensitivity profiles. The number of coefficients or, in other words, the extent of the interpolation kernel in k-space affects both the reconstruction speed and the artifact suppression quality. The extent of the kernel is selected such that it covers at least several sampled "source" k-space points to calculate the given missing "target" k-space point.

Coil weighting coefficients are typically defined based on the small portion of fully sampled k-space data, 16 to 32 lines for a typical 1D-acceleration case, which can either be acquired separately or integrated into the actual imaging scan in the form of ACS lines. The necessity of coil weighing calibration significantly hampers the scan time advantage gained via the parallel imaging acceleration, e.g. for an imaging scan with a nominal acceleration factor of 4 and 32 ACS lines, the true acceleration factor accounts only to 2.67. GRAPPA implementations with integrated ACS lines typically incorporate the ACS data into the k-space matrix, which allows for a certain improvement in the SNR of the resulting images. However, the high resolution portion of the data is still affected by the g-factor-related SNR penalty corresponding to the nominal acceleration factor.

"Phase-Scrambled" MRI

In the early days of MRI it was observed, that application of a quadratic phase modulation in object space leads to a dramatic transformation of the k-space signal appearance [8,9]. It was proposed to employ quadratic phase modulation to relax dynamic range requirements of the analog-to-digital converters (ADC) or digital-to-analog converters (DAC) as well as to reduce the peak power of the RF power amplifier. The term "phase scrambling" refers to the property of the signals, which, due to the presence of the phase modulation, remain mixed with almost random phase weighting factors and never add up constructively, independent of the k-space position.

Later, properties of k-space signals recorded in the presence of quadratic phase modulation across the imaged object were examined in detail [10]. Based on the observation made, new image reconstruction algorithms were proposed, which amongst other findings, were shown to have pronounced alias-suppressing properties. Recently, an alternative reconstruction algorithm of phase-scrambled MRI data was proposed, based on the Fresnel transformation [11], which allows for a relatively free scaling of the image FOV and suppressed the arising aliasing artifacts to a large extent. It has been shown, that upon employing an appropriate quadratic phase modulation, it is for example possible to reconstruct an 128-pixel image with the original nominal FOV from a k-space dataset with a nominal size of 256 pixels undersampled by a factor of 2. In other words from k-space 128 samples it is possible to reconstruct 128 image pixels, where quadratic phase modulation in the object domain allows for a flexible selection of image resolution and FOV during the reconstruction. Under idealized conditions, both resolution and SNR of thus reconstructed images approach the respective parameters of the traditional Fourier-encoded acquisitions with the equal matrix size.

In view of these aspects of prior art, it is the object of the present invention to introduce a method for accelerating data acquisition in MRI with N-dimensional spatial encoding to generate a high-resolution image free of artifacts in a time-efficient manner.

SUMMARY OF THE INVENTION

This object is achieved in accordance with the following inventive method steps:
a) preparing a transverse magnetization within an imaged object volume having a non-linear phase distribution;
b) effecting primary spatial encoding through application of switched magnetic fields;
c) simultaneously recording, using two or more RF receivers and during or following step b), MR signals originating from the imaged object volume, wherein, for each RF receiver, an N-dimensional data matrix is recorded which is undersampled by a factor $R_i$ per selected k-space direction; and
d) reconstructing data points belonging to a k-space matrix which were not recoded by the selected acquisition schema using a parallel imaging method, wherein reference information concerning receiver coil sensitivities is extracted from a phase-scrambled reconstruction of the undersampled data matrix, thereby improving data sampling efficiency and reducing overall data acquisition time.

The time efficiency of the spatial encoding in one, two or three spatial dimensions is achieved in accordance with the present invention by applying a specially designed non-linear modulation pattern to the phase of the transverse magnetization excited within the imaged object prior to the acquisition of MR signals. It is essential, that the resulting MR signals are recorded using a plurality of MR receiver coils at different locations, where the spatial modulation of the sensitivity of the coils provides additional spatial encoding of the signals. The primary spatial encoding occurs by application of switched magnetic fields (commonly linear gradient fields) to record MR signals following or under the action of those magnetic fields. The strength of the applied encoding fields and the number of the encoding steps may be selected such that the direct image reconstruction using a Fourier transform would result in the image FOV smaller than desired or image resolution lower than desired. Thereafter, an image reconstruction method is applied in accordance with the present invention, which applies a combination of FFT and phase-scrambled reconstruction to recover folded and unfolded images of different resolutions and FOVs from the same raw data, whereas the low-resolution full FOV images are then used to recover coil sensitivity calibration parameters, and arbitrary parallel imaging methods [1] are employed to unfold and combine intermediate images to the final high-resolution image. Optionally, an explicit phase-scrambled reconstruction of the low-resolution images can be avoided by a direct combination of the reconstruction with the selected parallel imaging reconstruction with the advantage of an improved signal-to-noise ratio (SNR) and image computation time. Alternatively, the reconstruction can be formulated as an optimization problem and solved using iterative optimization methods, such as the conjugate gradient method.

In accordance with the invention, preparation of the transverse magnetization within the imaged object or sub-volume of the imaged object with a strong non-linear distribution of the phase, is achieved either (i) by application of a single or several radiofrequency (RF) pulses transmitted by a single or several RF coils with or without simultaneous application of constant or variable in time magnetic field gradients, or (ii) by means of applying constant or pulsed currents to additional coils producing non-linear magnetic fields (e.g. shim coils of the second or higher order), or (iii) by a combination of the options (i) and (ii).

In traditional MRI, the number of encoding steps, the k-space sampling pattern, image resolution and field-of-view are tightly linked. Parallel imaging [1] allows to accelerate data acquisition via undersampling, but requires a sensitivity calibration of the receiver coil array. A great advantage of the present invention for numerous MRI methods and applications comes from the ability of the proposed approach to generate full-resolution images based on the undersampled k-space data, requiring neither a separate coil sensitivity acquisition nor modification of the k-space sampling pattern to include fully sampled regions for coil sensitivity calibration. In accordance with the present invention, simultaneous application of non-linear phase modulation in combination with a coil array signal reception has the advantage of relaxing the stringent relationship between the k-space sampling density, image resolution and FOV and resulting in numerous benefits in MRI pulse sequence design and applications. At the same time, the overall data acquisition efficiency is increased and the total scan times are decreased. The present invention also allows for extending the applicability of parallel imaging methods to a wider range of MRI applications, which for fundamental reasons, do not allow for a coil sensitivity calibration, e.g. imaging of fast non-periodic processes or continuously moving objects or certain imaging methods relying on a smooth, continuous data acquisition pattern.

The non-linear phase distribution of step a) is effected by application of at least one radio frequency pulse transmitted by at least one RF coil. This has the advantage of generating the known non-linear phase distribution based on the RF-coil and sample properties using reliable technology to produce time-modulated RF fields.

In a preferred embodiment of the invention, a special RF coil produces a B1 field with spatially modulated phase. This embodiment has the advantage that the special RF coil can be specifically designed to generate the required non-linear phase distribution.

In another embodiment of the invention, an array of RF coils produces a desired phase modulation via a combination of individual transmitter channels. This embodiment has the advantage of increasing the degrees of freedom available for generation of the non-linear phase distribution.

In a preferred embodiment of the invention, a spatially variable magnetic field, which is constant or variable in time, is simultaneously applied during transmission of the at least one radio frequency pulse over one or several transmitter channels. This embodiment has the advantage of increasing the degrees of freedom while facilitating 2 or 3 dimensional selective excitation with desired phase modulation.

In an additional embodiment of the invention, the non-linear phase distribution of step a) is effected by application of constant or pulsed currents to additional coils producing non-linear magnetic fields. This embodiment has the advantage of permitting direct modulation of the phase of the spins by altering the local resonance frequency for a period of time, assuming that the desired modulation pattern can be realized as a field map inside of a coil. This embodiment provides a time-efficient way to induce the phase modulation.

In a variation of the previous embodiment, the additional coils comprise shim coils of second or higher order. This has the advantage of using existing hardware to realize quadratic or higher-order phase modulation. This form of modulation is the most useful one to be implemented on the existing MR imagers.

In accordance with the invention, the strength of applied encoding fields and a number of encoding steps is selected such that direct image reconstruction using a Fourier transform would result in an image FOV smaller than a desired FOV or having an image resolution which is lower than desired. This has the central advantage underlying acceleration procedures of significantly shortening image acquisition times in comparison to a full encoding scheme satisfying the Nyquist conditions.

In a preferred embodiment of the invention, an image reconstruction method is subsequently applied, which uses a combination of FFT and phase-scrambled reconstruction to recover folded and unfolded images of different resolutions and FOVs from same raw data. This has the advantage of recovering images of varying spatial resolution and field of view from the same raw data. Significant flexibility is therefore effected in the image reconstruction pipeline thereby permitting corrections of the imaging parameters, such as spatial resolution, after completion of the measurement without having to repeat the measurement using different parameters.

In a preferred version of the latter embodiment, low-resolution full FOV images are used to recover coil sensitivity calibration parameters. This has the advantage of shortening the overall scanning time, since additional measurements for coil sensitivity calibration are not needed.

In a preferred embodiment of the invention, the parallel imaging methods are employed to unfold and combine intermediate images into a final high-resolution image. This embodiment has the advantage of producing a final image of good quality without having to satisfy the Nyquist criterion, thereby shortening the overall time for imaging.

In a further embodiment, an explicit phase-scrambled reconstruction of low resolution images is avoided by direct combination of reconstruction with the parallel imaging reconstruction of step d). This has the advantage of shortening the time for image reconstruction and permits use of signal spatial encoding in the most efficient and complete manner possible.

In a preferred embodiment of the invention, reconstruction is formulated as an optimization problem and solved using iterative optimization methods. This embodiment has the advantage of using the encoding potential of an arbitrary modulation function a complete manner, thereby resulting in images of highest possible quality.

In a preferred improvement of the latter embodiment, the iterative optimization method is a conjugate gradient method. This has the advantage of reducing memory and computation power requirements imposed on the image reconstruction infrastructure associated with use of iterative optimization methods, thereby rendering such methods feasible.

In a further preferred embodiment of the invention, a modulation function is altered for different steps of the primary phase encoding of step b). This has the advantage of increasing the degrees of freedom available for tailoring the non-linear phase distribution.

In an optimized variation of the latter embodiment, the modulation function is altered for 2 to 3 steps per primary encoding direction. This has the advantage of producing the required non-linear phase distribution with a minimum number of steps.

In a further preferred embodiment of the invention, k-space under sampling factors are varied. This has the advantage of selecting the undersampling in dependence on the k-space region to improve image quality for a given scanning time.

In an improvement of the latter embodiment, no area of k-space achieves a Nyquist sampling density. This has the advantage of providing adequate image quality in the shortest possible imaging time.

Further important features of the invention can be extracted from the embodiments illustrated in the drawings, The various embodiments shown and described below can be utilized in accordance with the invention either individually or in arbitrary combination.

DESCRIPTION OF THE PREFERRED EMBODIMENT

Figure 1:
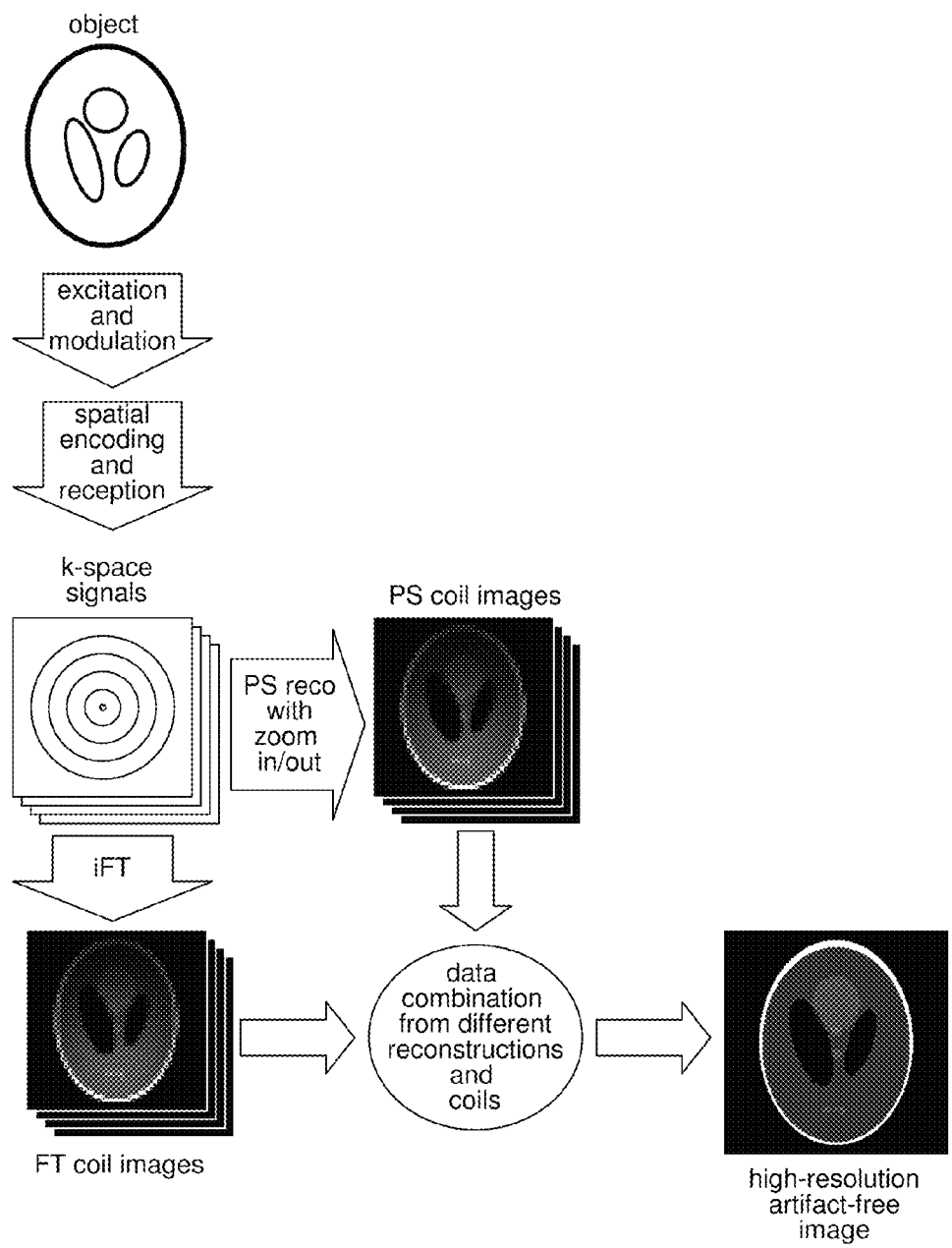
FIG. 1 shows a general concept behind the present invention, where additional phase modulation is applied to MR signals prior or during the spatial encoding, enabling image reconstructions with different resolutions FOVs and aliasing artifacts. The data combination step is applied to these intermediate images to recover the final high-resolution artifact-free image of the object.

The present invention achieves an increased efficiency and thus time saving in spatial encoding of MR signals based on a combination of the non-linear spatial modulation of the phase of the signals with efficient signal reception using an RF receiver coil array. The scope of the present invention extends beyond the combined use of linear gradients for primary spatial encoding and quadratic phase modulation to achieve phase scrambling; indeed non-linear magnetic fields, as in PatLoc approach [12] or a combination of those fields with linear gradients may be used for primary spatial encoding in combination with a phase modulation function having a significantly non-linear representation in the distorted coordinate space defined by the primary encoding fields. E.g. phase modulation of the third or fourth order may be used in combination with a quadrupolar encoding fields. Additionally, more than a single phase modulation function can be applied to the different steps of the primary spatial encoding. For the sake of clarity, only the quadratic phase modulation combined with the linear gradient spatial encoding is described in more detail below.

Convolution Reconstruction Theory

The following section considers, without loss of generality, the case of one-dimensional spatial encoding of a sample placed within a homogeneous RF coil; multidimensional MRI formulation and extension to receiver coil arrays follow as trivial generalizations of the described approach.

K-space signals of a sample with a magnetization density $\beta(x)$ ignoring relaxation, $B_0$ and $B_1$ inhomogeneities can be expressed as follows:

$$s(k) = \int \rho(x)\exp(-i2\pi kx)dx = \int \rho(x)\exp\left(-i2\pi \frac{k}{k_{max}}\frac{x}{\Delta x}\right)dx, \quad (1)$$

where integration is performed over the sensitive volume of the receiver coil; $k_{max}$ and $\Delta x$ are the k-space sampling extent and resolution in image space and are introduced into the right hand equation based on the k-space sampling definition, where $k_{max}\Delta x \equiv 1$. Upon introduction of dimensionless variables:

$$\eta = \frac{k}{k_{max}}, \xi = \frac{x}{\Delta x}, \quad (2)$$

and using a trivial substitution:

$$2\eta\xi = \eta^2 + \xi^2 - (\eta-\xi)^2 \quad (3)$$

Equation (1) for k-space signals transforms into:

$$s(\eta k_{max}) = \int \rho(\xi\Delta x)\exp(-i\pi\eta^2)\exp(-i\pi\xi^2)\exp(i\pi(\eta-\xi)^2) \Delta x d\xi. \quad (4)$$

By defining a chirp function $g(\theta)=\exp(i\pi\theta^2)$, modulated spin density and modulated k-space signal variables can be introduced as:

$$\rho'(\xi)=\rho(\xi\Delta x)\Delta x g^*(\xi),$$

$$s'(\eta)=s(\eta k_{max})g(\eta), \quad (5)$$

which enables to simplify greatly Equation (4). Indeed, modulated signal intensity can now be expressed as a convolution of the modulated spin density with the chirp function as:

$$s'(\eta)=\int\rho'(\xi)\exp(i\pi(\eta-\xi)^2)d\xi, \quad (6)$$

or in a shorthand notation:

$$s'=\rho' \otimes g. \quad (7)$$

The chirp function used as a convolution kernel in Equations (6) and (7) is a pure phase term, which upon using the Fourier convolution theorem and explicit Fourier transform of a Gaussian function, permits one to formulate the image reconstruction problem in terms of a convolution with a conjugated chirp:

$$\rho'=s'\otimes g^*. \quad (8)$$

The above derivations of the convolution interpretation of MR image reconstruction are entirely equivalent to the traditional Fourier transform. However, the presence of a convolution with an explicit kernel invites study of properties of this convolution kernel in more detail and investigation of the possibilities of changing this kernel to subsequently modify properties of image reconstruction.

Noteworthy is also that Equation (8) describes a transformation from the frequency to the spatial domain without a Fourier transform. To efficiently calculate Equation (8) a Fourier convolution theorem may be applied making it equivalent to Equation (9) in [11]. In analogy with this publication, we consider a convolution kernel modified as:

$$g_\alpha(\theta)=\exp(i\pi\alpha\theta^2), \quad (9)$$

where $\alpha$ is the scaling parameter, defining the resolution and FOV of the reconstructed image. As shown previously by us [13,14], sampling properties such as aliasing can be directly observed from a discretization of the modified kernel in Equation (9). In order to be able to suppress aliasing with scaled kernels, a further modification of the kernel is required:

$$g_{\alpha w}(\theta)=w_\alpha(\theta)\exp(i\pi\alpha\theta^2), \quad (10)$$

where $w_\alpha(\theta)$ is a window function normalized accordingly to preserve the resulting image intensity. A variety of window functions can be employed, e.g. a Fermi band-pass filter.

For the convolution reconstruction with a windowed kernel to work properly, e.g. to be able to create an alias-free full FOV image, the window size must be large enough for the kernel to be able to reallocate the k-space signals to the appropriate positions in image space. For zoomed-in image reconstruction with the scaling parameter $\alpha>1$, the window function must have an extent smaller than the full image FOV to suppress aliasing. Correspondingly, in order to allow for the image intensity to be correctly transferred from k-space to image space with the windowed kernel, k-space echo locations from different image regions need to be modified. This can be achieved by inducing a phase modulation prior to the primary gradient encoding. The induced k-space echo shift in pixels must be large enough for signals from all image locations:

$$\Delta k(x) \geq |x \pm W|, \quad (11)$$

where $\Delta k(x)$ is a k-space echo shift for the location given by x, and W is a distance from the window function center to its cut-off edge. Equation (11) shall be fulfilled either for + or − sign on the right hand side.

K-Space Signal Shifts

It is essential to the present invention that MR signals are treated prior to or during the signal acquisition process in such a way that the recorded k-space signals are reallocated compared to the normal untreated situation, when signals in the source space are typically assumed to have approximately zero phase. The goal of this signal treatment is to separate k-space echoes originating from different locations within the object. The correlations between k-space and object space are combined with those introduced by use of a plurality of inhomogeneous receiver coils comprising the receiver coil array to allow for an accelerated spatial encoding, resolution and SNR improvement and suppression of residual artifacts.

The most trivial way to fulfill Equation (11) is to prepare the MR signals for the k-space echo shift to be proportional to the position in object space. According to the Fourier shift theorem, k-space shift is proportional to the local gradient of the signal phase. Therefore the desired k-space signal allocation can be achieved if the derivative of the signal phase in object space is proportional to the coordinate. A quadratic phase modulation function $$\psi=\beta x^2, \quad (12)$$

where $\beta$ describes the strength of the applied modulation, clearly fulfills this requirement. The strength of the quadratic phase modulation controls the extent of the k-space echo offset and defines the maximum resolution of the alias-free image reconstructed using the convolution method. In accordance with the present invention, the applied phase modulation should be sufficient to describe the sensitivities of the used receiver coils with accuracy sufficient for artifact-free image reconstruction. Excessive phase modulation in the object will result in intravoxel signal dephasing. For the given resolution and imaging settings, a range of optimal phase modulation exists, where the modulation readily provides additional information but does not cause intravoxel dephasing.

Phase modulation rules can be generalized to the case, where non-linear magnetic fields are used for the primary spatial encoding. In this case in addition to the object space and the k-space, an additional so-called encoding space is defined, whose geometry and topology is characterized by the encoding fields used [15]. Hence, phase modulation applied to the object shall approximate Equation (12) in the encoding space.

Alternative phase modulation functions might be of advantage to improve conditioning of the image reconstruction. Amongst them, a pseudo-random modulation deserves special mention. This modulation will result in pseudo-random k-space echo shifts, essentially distributing signals over k-space. If this modulation is too strong, signal loss due to intravoxel dephasing in object space will result. However, for moderate modulations, low-resolution artifact-free images may be recovered from a fraction of k-space data.

Method Implementation

In accordance with the present invention, as depicted in FIG. 1, acquisition of the image of an object begins with a selective or non-selective excitation of the spins, followed by or combined with modulation of the phase of the exited magnetization. The modulation function has the special property of being significantly non-linear with respect to the spatial coordinates. In case of the non-linear magnetic fields used for the primary spatial encoding, the modulation function is required to have a non-linear representation with regard to the encoding coordinate system defined by the primary encoding fields used. A single or several modulation functions can be used for different steps of the primary spatial encoding. In accordance with the present invention, parameters of the primary spatial encoding can be chosen for the resolution and/or FOV of the image recovered by an inverse Fourier transform of the recorded data to be lower than desired and possibly resulting in aliasing artifacts. MR signals are recorded by a receiver coil array containing two or more receiver coils with inhomogeneous sensitivities. In addition to the inverse Fourier reconstruction, phase-scrambled reconstruction is also applied to the same raw data to recover images with FOV and resolution different to the nominal values.

The essence of the present invention lies in the observation that, in the presence of the non-linear phase modulation, the two reconstructions produce significantly different images characterized by different artifacts. Combination of the two reconstructions enables one to recover an image combining the best properties of the two reconstructions, e.g. higher spatial resolution with larger FOV.

Figure 2:
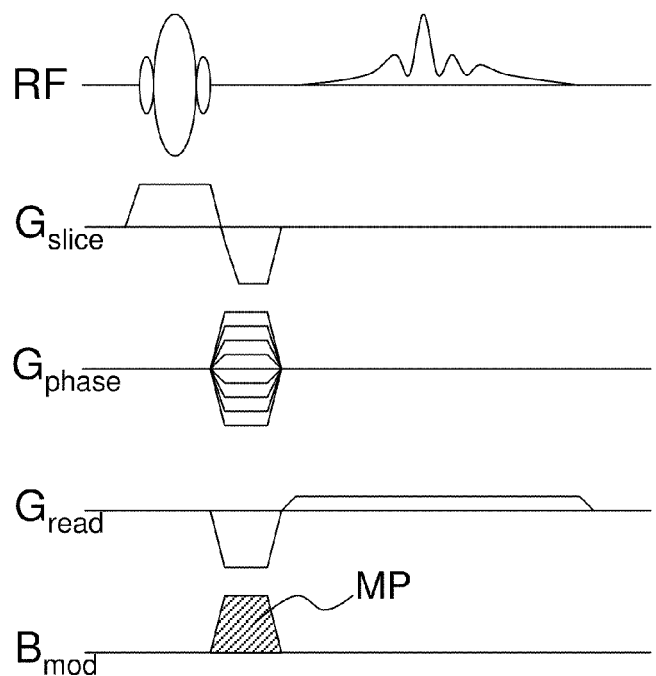
FIG. 2 presents a 2D gradient echo pulse sequence diagram using an additional coil and corresponding driving circuits to modulate the magnetic field across the imaged object.

FIG. 2 presents a schematic diagram of a 2D gradient echo imaging sequence, where an additional electrically controllable coil is used to induce phase modulation. The three gradient coils $G_{slice}$, $G_{phase}$ and $G_{read}$ are driven by electric currents in accordance with the diagram to provide the primary spatial encoding. The aforementioned additional modulation coil is characterized by a non-linear spatial field dependence in the coordinates defined by the primary spatial encoding. Depending on the realization and the performance of the modulation coil and the driving electronic circuitry, the phase modulation can be realized as one or several pulses or as a continuous current of a lower amplitude, as long as it serves the purpose of inducing a desired phase modulation across the imaged object up to the time point of the gradient echo. The method can be trivially extended to a 3D encoding scheme by adding a phase encoding gradient table to the slice axis.

Figure 3:
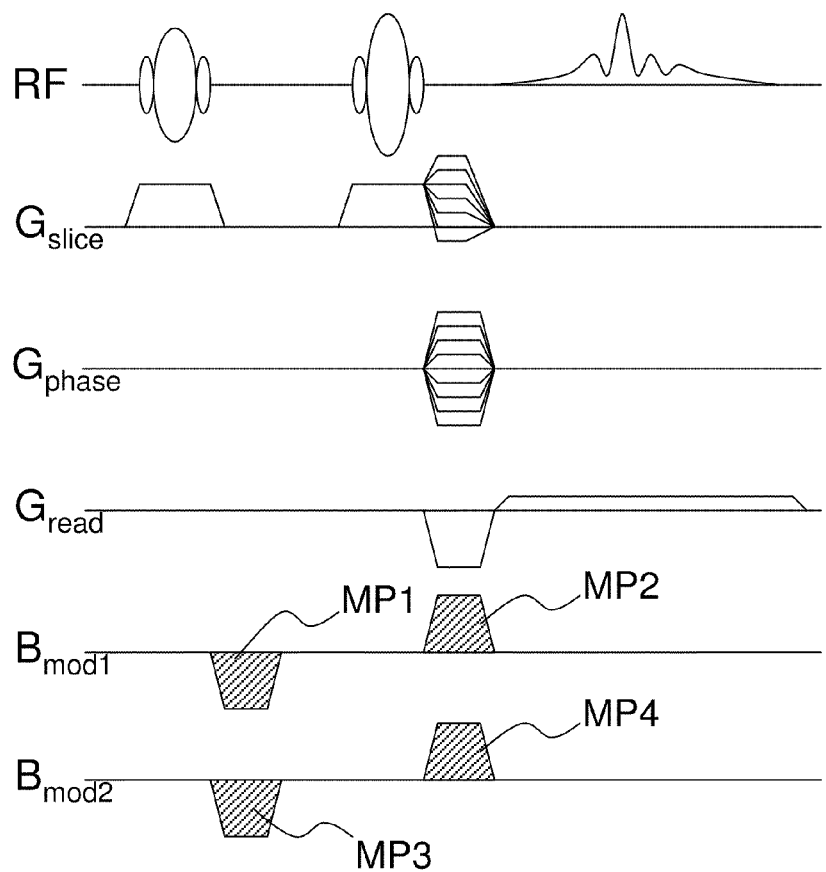
FIG. 3 presents a 3D spin echo pulse sequence diagram using one or two additional coils and corresponding driving circuits to modulate the magnetic field across the imaged object in one or two of the spatial dimensions undergoing sequential phase encoding.

FIG. 3 presents a schematic diagram of a 3D spin echo imaging sequence, where the accelerated spatial encoding in accordance with the present invention may optionally be applied to phase encoding, slice (partition) encoding or both encoding directions simultaneously. The three gradient coils $G_{slice}$, $G_{phase}$ and $G_{read}$ are driven by electric currents in accordance with the diagram to provide the primary spatial encoding. The desired non-linear phase modulation is induced by means of either one or several additional coils characterized by non-linear field dependencies in the coordinate system defined by the primary spatial encoding. Depending on the realization and the performance of the modulation coils and the driving electronic circuitry, the phase modulation can be realized as one or several pulses or as continuous currents of lower amplitude as long as it serves the purpose of inducing a desired phase modulation across the imaged object in one or multiple spatial dimensions up to the time point of the echo. The method can be trivially converted to a 2D encoding scheme by removing the phase encoding gradient table from the slice axis.

Figure 4:
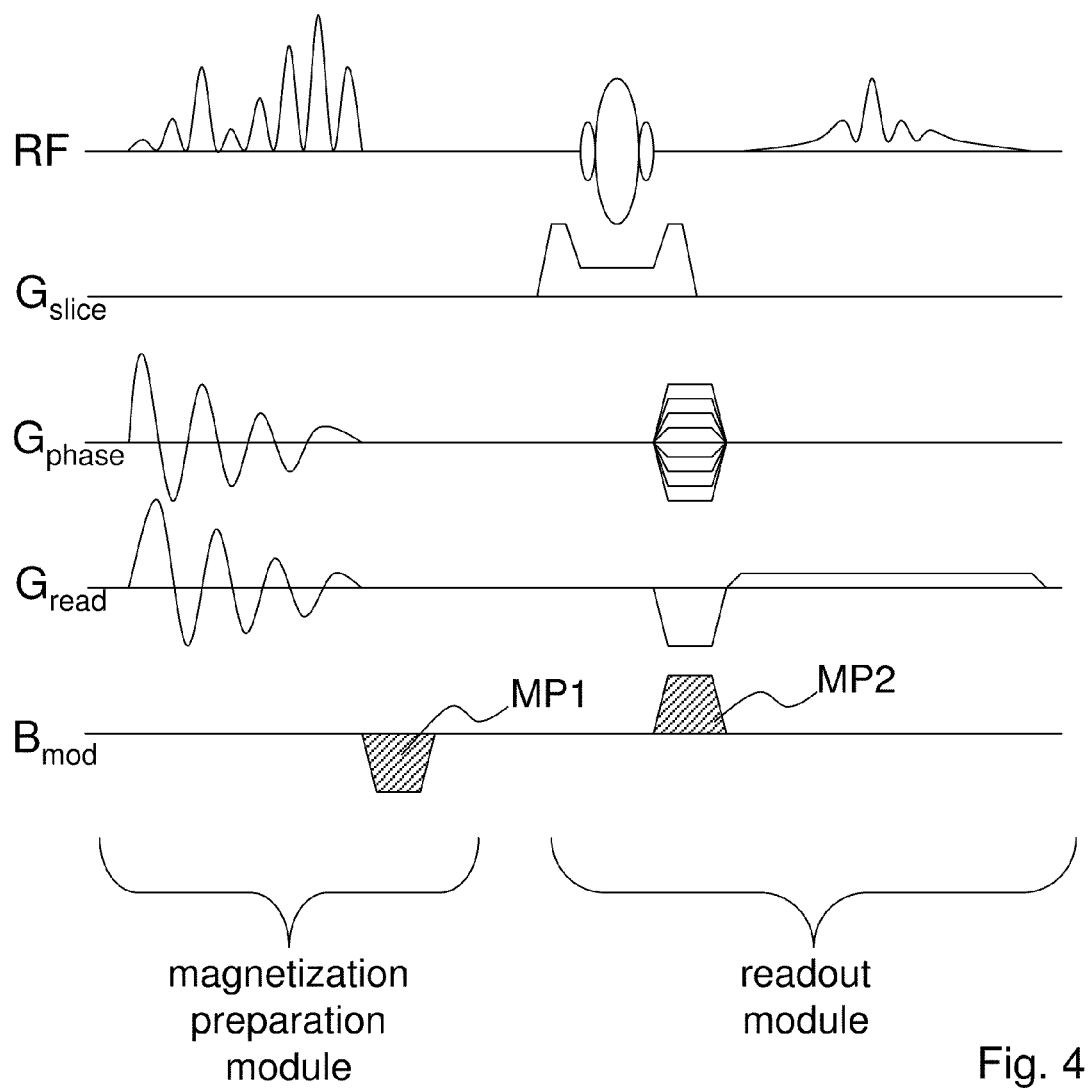
FIG. 4 shows a generalized concept of combining tailored RF excitation pulse to perform spatial selection and modulation optionally combined with an additional modulation using one or several magnetic field modulation coils; followed by a generic 2D or 3D read-out module, which may incorporate one or several refocusing pulses and optionally one or several phase modulation pulses.

A generalized concept of combining tailored RF excitation to perform spatial selection and modulation, optionally followed by or combined with an additional modulation using one or several magnetic field modulation coils; followed by a generic 2D or 3D spatial encoding module, which may incorporate one or several refocusing pulses and optionally one or several phase modulation pulses is presented in FIG. 4. The described tailored excitation module can be realized by means of one or several RF pulses with constant or modulated amplitudes, constant or swept carrier frequencies, played out on a single or several RF transmitter channels, applied prior, during or interleaved with gradient or modulation fields. In the most general case, the described magnetization preparation and modulation module may be combined with an arbitrary signal readout module.

Figure 5:
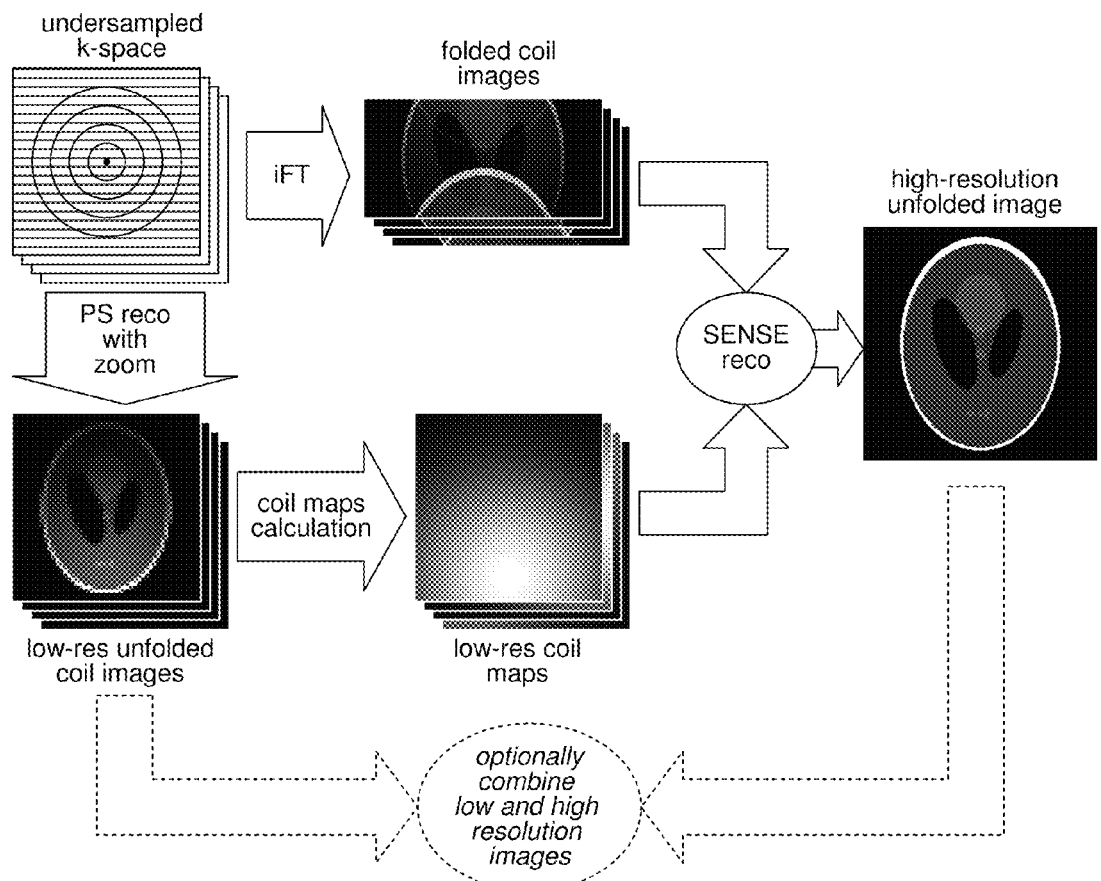
FIG. 5 presents the image space reconstruction flow chart.

A image space reconstruction flow chart for the undersampled data is presented in FIG. 5. In accordance with the Nyquist sampling condition, application of the inverse Fourier transform to the undersampled data results in images with reduced FOV and thus undesired aliasing artifacts. However, the images originating from the different RF receivers are modulated with the sensitivities of the corresponding receiver coils, and this modulation occurs prior to the signal aliasing. For the k-space data acquired with the appropriate non-linear phase modulation, a phase-scrambled reconstruction can be applied, to recover low-resolution full FOV images of the object. The low-resolution images of the object originating from different RF receivers are modulated by the sensitivities of the corresponding received coils. Based on the fact that coil sensitivities are rather smooth, they can be estimated based on the low-resolution images resulting from the phase-scrambled reconstruction. The sensitivities recovered from the same undersampled k-space data are then used to unwrap aliased images via an application of the SENSE algorithm or a modification thereof to recover a high-resolution full FOV image. As an optional finishing step, the high-resolution image can be combined with the low-resolution intermediate image to further improve SNR of the resulting reconstruction.

Figure 6:
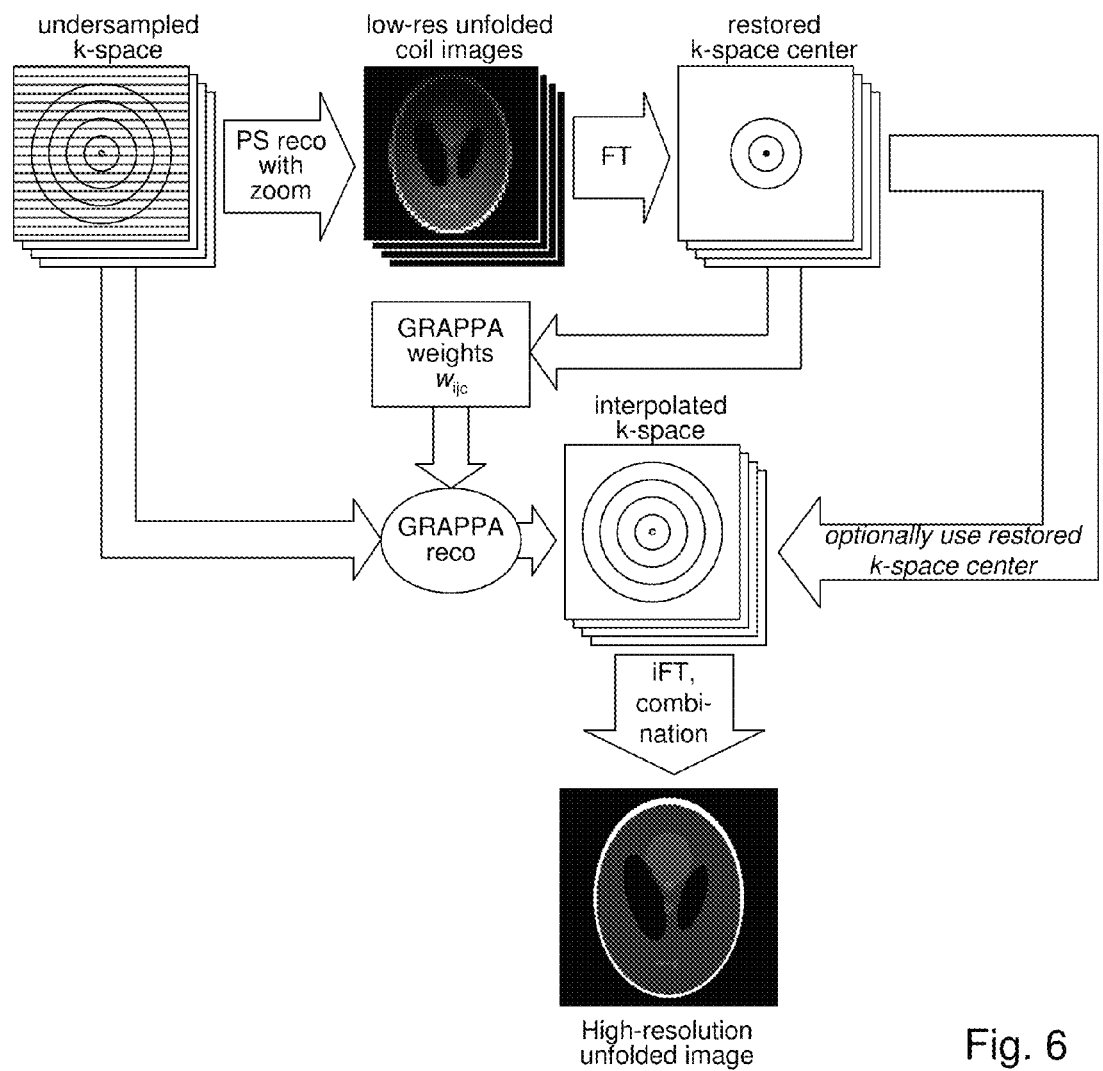
FIG. 6 shows the k-space reconstruction flow chart.

A schematic k-space reconstruction flow chart is presented in FIG. 6. In the first step, a phase-scrambled reconstruction is applied to the undersampled k-space data to recover a plurality of low-resolution alias-free images corresponding to the different RF receivers used to record the data. These low-resolution images, carrying information of the receiver coil sensitivities, are then Fourier-transformed to create a synthetic k-space dataset. The dataset corresponds to the center of the fully-sampled k-space data, and hence can be used to estimate the correlations between the neighboring k-space lines arising due to use of the receiver coil array.

The synthetic dataset is then used to calculate the reconstruction coefficients (weights) for the GRAPPA algorithm. These weights are then applied to the original k-space data to interpolate the missing lines and thereby create an approximation of the fully-sampled k-space. Optionally, the synthetic k-space center restored by the phase-scrambled reconstruction can be used to fill a fraction of the data. An inverse Fourier transform is then applied to the interpolated k-space data followed by a multi-channel coil combination method of choice to recover the combined high-resolution full FOV image.

Figure 7:
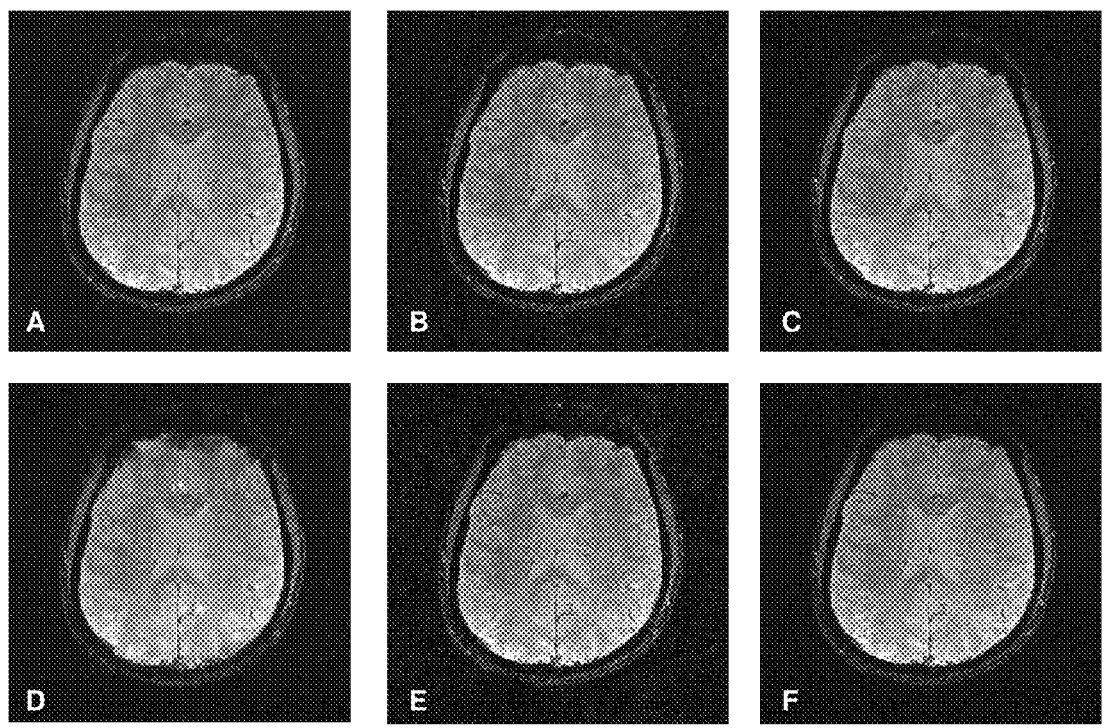
FIG. 7 presents exemplary images reconstructed from the fully encoded data comprising 256 k-space lines (A); SENSE reconstruction of the undersampled data comprising 128 k-space lines and requiring additional coil sensitivity data based on additional 32 lines (B); GRAPPA reconstruction of the undersampled data comprising 128 k-space lines with the 32 ACS block (C); convolution reconstruction of the undersampled data comprising 128 k-space lines with reduced resolution (D); full resolution image space reconstruction of the undersampled data comprising 128 k-space lines according to the present invention (E); full resolution k-space reconstruction of the undersampled data comprising 128 k-space lines according to the present invention (F).

FIG. 7 presents exemplary images acquired from a normal human volunteer on a TIM Trio 3T Scanner (Siemens Healthcare, Erlangen, Germany) with a standard 12 channel head receiver coil array. Presented is a single slice of a 3D gradient echo acquisition. Fully-encoded raw data with $256^2$ matrix, FOV=256 mm, 16 2 mm thick partitions were acquired with TR=150 ms, FA=15° and retrospectively undersampled to simulate accelerated acquisitions. With the A22 second order shim current offset to the maximum, TE=25 ms was required to achieve a sufficient quadratic phase modulation. The image reconstructed by Fourier-transforming the fully encoded data comprising 256 k-space lines is presented in FIG. 7A.

To test the performance of the standard SENSE reconstruction, a block of 32 densely sampled k-space lines in $k_y$ direction close to the k-space center was extracted to reconstruct low-resolution images and calculate coil sensitivities. The original dataset was then undersampled and Fourier-transformed to produce aliased images. These images were then unwrapped according to the SENSE algorithm by using the calculated coil sensitivities, with the resulting image presented in FIG. 7B.

To assess the performance of the standard GRAPPA reconstruction, a block of 32 densely sampled k-space lines in $k_y$ direction close to the k-space center was extracted and used to calculate GRAPPA weighting coefficients. The original dataset was then undersampled and the missing k-space lines were interpolated according to the GRAPPA approach. The resulting k-space data were then Fourier-transformed and combined into a single composite image presented in FIG. 7C.

Note that image 7A was reconstructed using 256 k-space lines, whereas images 7B and 7C using 144 k-space lines, respectively. The following images 7D-F are all reconstructed using 128 k-space lines based on the same undersampled dataset.

In FIG. 7D, a phase-scrambled reconstruction of the undersampled dataset is presented. The FOV recovery is apparent, however, the image has a lower spatial resolution and some aliasing artifacts originating from sharp edges in the image may be observed.

FIG. 7E presents the result of the image space reconstruction in accordance with the present invention. Recovery of both image resolution and FOV is apparent. A certain noise increase in the areas of no signal is associated with an inferior algorithm used to extrapolate the sensitivity maps and is not an intrinsic limitation of the present approach.

In FIG. 7F, the result of k-space reconstruction in accordance with the present invention is presented. The resolution, FOV and general image quality recovery appear to be optimal, making FIG. 7F practically indistinguishable from FIG. 7C.

Images in FIGS. 7E and 7F demonstrate the ability of the present invention to recover high-quality high-resolution full FOV images from the undersampled k-space data sets without requiring additional receiver coil calibration measurements. Further increase in image quality is expected by using specialized, more efficient phase modulation techniques and combined reconstruction strategies. At this juncture a considerable potential is attributed to iterative reconstruction techniques, which enforce a consistency between the reconstructed images and the measured data.

References

[1] Larkman Dj, Nunrs R G. Parallel magnetic resonance imaging. Review. Phys Med Biol 52:R15-R55 (2007).
[2] Shannon C E. Communication in the presence of noise. Proc. Institute of Radio Engineers 37(1):10-21 (1949).
[3] Sodickson D K, Manning W J. Simultaneous acquisition of spatial harmonics (SMASH): fast imaging with radiofrequency coil arrays. Magn Reson Med 38(4):591-603 (1997).
[4] Pruessmann K P, Weiger M, Scheidegger M B, Boesiger P. SENSE: sensitivity encoding for fast MRI. Magn Reson Med 42(5):952-62 (1999).
[5] Griswold M A, Jakob P M, Heidemann R M, Nittka M, Jellus V, Wang J, Kiefer B, Haase A. Generalized autocalibrating partially parallel acquisitions (GRAPPA). Magn Reson Med 47(6):1202-10 (2002).
[6] Ullmann P, Tieng Q, Galloway G, Hennig J. "Relative SENSE (rSENSE) and Calculation of Sensitivity Maps from k-Space Reconstruction Coefficients (SMACKER)" In: Proceedings of ISMRM, Kyoto, p. 2406 (2004).
[7] Wang J, Kluge T, Nittka M, Jellus V, Kuehn B, Kiefer B. Parallel Acquisition Techniques with Modified SENSE Reconstruction mSENSE. In: Proceedings of the First Wurzburg Workshop on Parallel Imaging, Wurzburg, p. 92 (2001).
[8] Maudsley A A. Dynamic Range Improvement in NMR Imaging Using Phase Scrambling, Journal of Magnetic Resonance 76:287-305 (1988).
[9] Wedeen V J, Chao Y S, Ackerman J L. Dynamic range compression in MRI by means of a nonlinear gradient pulse. Magn Reson Med 6(3):287-95 (1988).
[10] Pipe J G. Spatial encoding and reconstruction in MRI with quadratic phase profiles. Magn Reson Med 33:24-33 (1995).
[11] Satoshi Ito S, Yamada Y. Alias-free image reconstruction using Fresnel transform in the phase-scrambling Fourier imaging technique. Magn Reson Med 60:422-30 (2008).
[12] Hennig J, Welz A M, Schultz G, Korvink J, Liu Z, Speck O, Zaitsev M. Parallel imaging in non-bijective, curvilinear magnetic field gradients: a concept study. MAGMA 21(1-2):5-14 (2008).
[13] Zaitsev M, Schultz G, Hennig J. Extended anti-aliasing reconstruction for phase-scrambled MRI with quadratic phase modulation. In: Proceedengs of ISMRM, Honolulu, p. 2859 (2009).
[14] Zaitsev M, Hennig J. Reference-free parallel imaging with phase scrambling. In: Proceedengs of ISMRM, Honolulu, p. 2676 (2009).
[15] Schultz G, Hennig J, Zaitsev M. Image Reconstruction from ambiguous PatLoc-encoded MR data. In: Proceedengs of ISMRM, Toronto, p. 786 (2008).

We claim:

1. A method for accelerating data acquisition in MRI with N-dimensional spatial encoding to generate a high-resolution image free of artifacts in a time-efficient manner, the method comprising the steps of:
   a) preparing, within an imaged object volume, a transverse magnetization having a spatially non-linear phase distribution;
   b) effecting primary spatial encoding through application of switched magnetic fields;
   c) simultaneously recording, using two or more RF receivers and during or following step b), MR signals originating from the imaged object volume, wherein, for each RF receiver, an N-dimensional data matrix is recorded which is undersampled by a factor $R_i$, per selected k-space direction; and
   d) reconstructing data points belonging to a k-space matrix which were not recoded by a selected acquisition schema using a parallel imaging method, wherein reference information concerning receiver coil sensitivities is extracted from a phase-scrambled reconstruction of the undersampled data matrix, thereby improving data sampling efficiency and reducing overall data acquisition time, wherein a strength of applied encoding fields and a number of encoding steps is selected such that direct image reconstruction using a Fourier transform would result in an image FOV smaller than a desired FOV or having an image resolution which is lower than desired.

2. The method of claim 1, wherein the non-linear phase distribution of step a) is effected by application of at least one radio frequency pulse transmitted by at least one RF coil.

3. The method of claim 2, wherein a special RF coil produces a B1 field with spatially modulated phase.

4. The method of claim 2, wherein an array of RF coils produces a desired phase modulation via a combination of individual channels.

5. The method of claim 2, wherein a spatially variable magnetic field, which is constant or variable in time, is simultaneously applied during transmission of the at least one radio frequency pulse.

6. The method of claim 1, wherein the non-linear phase distribution of step a) is effected by application of constant or pulsed currents to additional coils producing non-linear magnetic fields.

7. The method of claim 6, wherein the additional coils comprise shim coils of second or higher order.

8. The method of claim 1, wherein a desired phase modulation is set proportional to a second power of a coordinate in a spatial direction corresponding to a direction undersampled by the primary spatial encoding.

9. The method of claim 8, wherein non-linear magnetic fields are used for spatial encoding, and the desired phase modulation is set proportional to a second power of a non-linear coordinate defined by a spatial dependency of the primary encoding field.

10. The method of claim 1, wherein an image reconstruction method is subsequently applied, which uses a combination of FFT and phase-scrambled reconstruction to recover folded and unfolded images of different resolutions and FOVs from same raw data.

11. The method of claim 10, wherein low-resolution full FOV images are used to recover coil sensitivity calibration parameters.

12. The method of claim 11, wherein parallel imaging methods are employed to unfold and combine intermediate images to a final high-resolution image.

13. The method of claim 1, wherein an explicit phase-scrambled reconstruction of low resolution images is avoided by direct combination of reconstruction with the parallel imaging reconstruction of step d).

14. The method of claim 1, wherein reconstruction is formulated as an optimization problem and solved using iterative optimization methods.

15. The method of claim 14, wherein the iterative optimization method is a conjugate gradient method.

16. The method of claim 1, wherein a modulation function is altered for different steps of the primary phase encoding of step b).

17. The method of claim 16, wherein the modulation function is altered for 2 to 3 steps per primary encoding direction.

18. The method of claim 1, wherein k-space undersampling factors are varied.

19. The method of claim 18, wherein no area of k-space achieves a Nyquist sampling density.

* * * * *